United States Patent
Lee et al.

(10) Patent No.: US 9,515,287 B2
(45) Date of Patent: Dec. 6, 2016

(54) ORGANIC LIGHT-EMITTING DISPLAY APPARATUS HAVING ENCAPSULATION LAYER OF LOW TEMPERATURE VISCOSITY TRANSITION AND METHOD OF MANUFACTURING THE SAME

(71) Applicant: SAMSUNG DISPLAY CO., LTD., Gyeonggi-do (KR)

(72) Inventors: Jae-Sun Lee, Gyeonggi-Do (KR); Ung-Soo Lee, Gyeonggi-Do (KR); Sang-Young Park, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/220,184

(22) Filed: Mar. 20, 2014

(65) Prior Publication Data

US 2015/0034916 A1    Feb. 5, 2015

(30) Foreign Application Priority Data

Jul. 30, 2013   (KR) ........................ 10-2013-0090424

(51) Int. Cl.
*H01L 29/08*    (2006.01)
*H01L 51/52*    (2006.01)

(52) U.S. Cl.
CPC ....... *H01L 51/5253* (2013.01); *H01L 51/5246* (2013.01)

(58) Field of Classification Search
CPC .............................. H01L 51/5253; H01L 51/56
USPC ......................................................... 257/40
See application file for complete search history.

(56) References Cited

U.S. PATENT DOCUMENTS

| | | | |
|---|---|---|---|
| 7,722,929 B2 | 5/2010 | Aitken et al. | |
| 7,829,147 B2 | 11/2010 | Aitken et al. | |
| 2007/0040501 A1 | 2/2007 | Aitken et al. | |
| 2009/0121333 A1 | 5/2009 | Aitken et al. | |
| 2010/0134426 A1 | 6/2010 | Lee et al. | |
| 2013/0230664 A1* | 9/2013 | Park .................... | H01L 51/5253 427/523 |
| 2014/0091296 A1* | 4/2014 | Yoo et al. ........................ | 257/40 |
| 2014/0319997 A1* | 10/2014 | Lee ......................... | H05B 33/04 313/504 |

FOREIGN PATENT DOCUMENTS

| | | | |
|---|---|---|---|
| JP | 2009145582 | | 7/2009 |
| KR | 1020080045217 | | 5/2008 |
| KR | 1020100061121 | | 6/2010 |
| WO | WO2013073846 | * | 5/2013 |

* cited by examiner

*Primary Examiner* — Hung Vu
(74) *Attorney, Agent, or Firm* — F. Chau & Associates, LLC

(57) ABSTRACT

An organic light-emitting display apparatus includes a substrate, a display unit, an encapsulation layer, and a protection layer. The display unit is formed on the substrate. The encapsulation layer covers the display unit. The protection layer is formed on the encapsulation layer. The encapsulation layer is formed of a low temperature viscosity transition (LVT) inorganic material. The protection layer is formed of an elastic, adhesive material to protect the encapsulation layer from an external force.

10 Claims, 3 Drawing Sheets

ORGANIC LIGHT-EMITTING DISPLAY APPARATUS HAVING ENCAPSULATION LAYER OF LOW TEMPERATURE VISCOSITY TRANSITION AND METHOD OF MANUFACTURING THE SAME

CROSS-REFERENCE TO RELATED APPLICATION

This application claims priority under U.S.C 191 to Korean Patent Application No. 10-2013-0090424, filed on Jul. 30, 2013 in the Korean Intellectual Property Office, the disclosure of which is incorporated herein by reference in its entirety.

TECHNICAL FIELD

The present invention relates to an organic light-emitting display apparatus and a method of manufacturing the same.

DISCUSSION OF RELATED ART

Organic light-emitting displays are self-luminous, including a plurality of organic light-emitting devices. Each organic light-emitting device includes a hole injection electrode, an electron injection electrode, and an organic emission layer provided therebetween. Excitons are generated when a hole injected from the hole injection electrode is recombined with an electron injected from the electron injection electrode in the organic emission layer. Light is emitted when the excitons fall from an excited state to a ground state.

Since organic light-emitting displays are self-luminous, a separate light source is unnecessary. Therefore, the organic light-emitting displays may be driven at a low voltage and may be lightweight and slim. The organic light-emitting device is sealed to block external moisture or oxygen.

SUMMARY

According to an exemplary embodiment of the present invention, an organic light-emitting display apparatus includes a substrate, a display unit, an encapsulation layer, and a protection layer. The display unit is formed on the substrate. The encapsulation layer covers the display unit. The protection layer is formed on the encapsulation layer. The encapsulation layer is formed of a low temperature viscosity transition (LVT) inorganic material. The protection layer is formed of an elastic, adhesive material to protect the encapsulation layer from an external force.

According to an exemplary embodiment of the present invention, a manufacturing method of an organic light-emitting display apparatus is provided. A display unit is formed on a substrate. An encapsulation layer is formed on the substrate. The encapsulation layer covers the display unit. A protection layer is formed on the encapsulation layer. An upper film is stacked on the protecting layer. The encapsulation layer is formed of a low temperature viscosity transition (LVT) inorganic material. The protection layer is formed of silicon-based optically-curable or thermally-curable resin that is elastic and adhesive.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EXEMPLARY EMBODIMENTS

Figure 1:
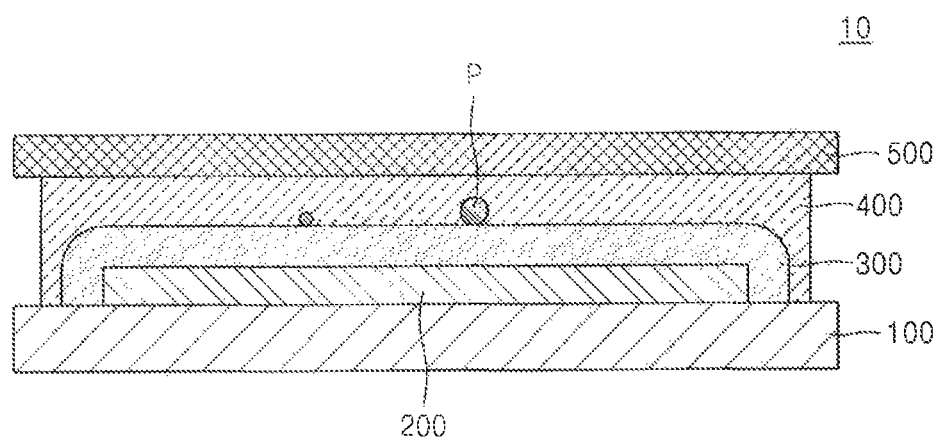
FIG. 1 is a cross-sectional view of an organic light-emitting display apparatus according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
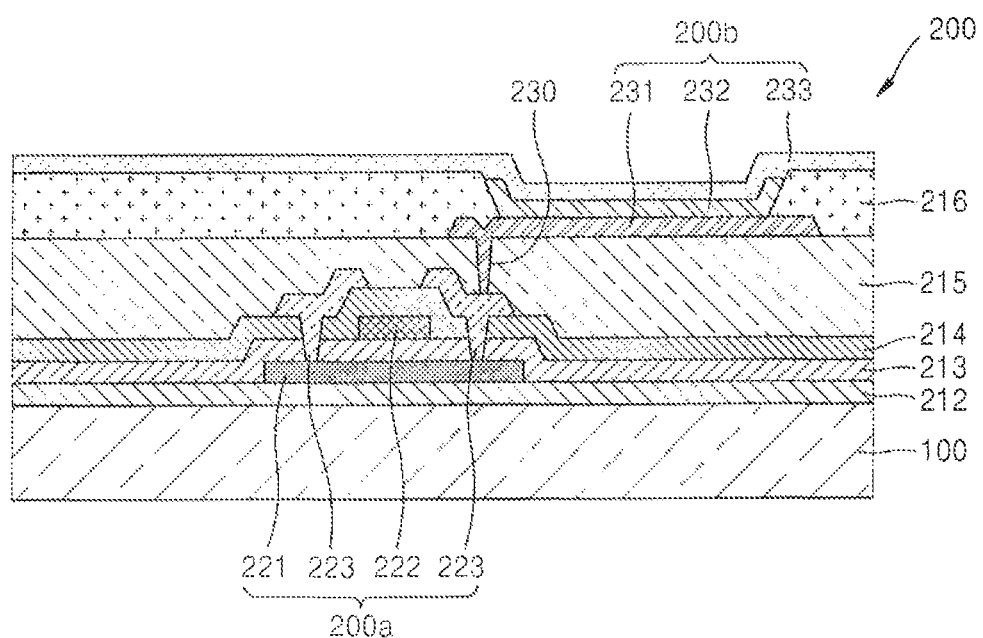
FIG. 2 is a cross-sectional view of a display unit according to an exemplary embodiment of the present invention.
Figure 3:
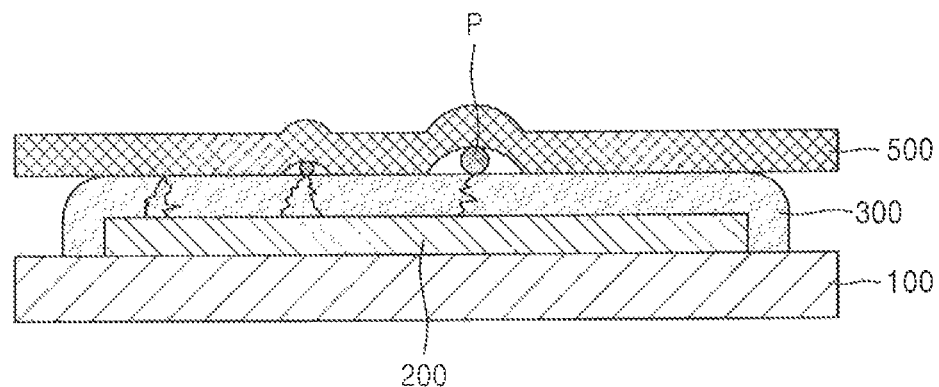
FIG. 3 is a cross-sectional view illustrating a comparative example against an exemplary embodiment of the present invention.

FIG. 1 is a cross-sectional view of an organic light-emitting display apparatus 10 according to an exemplary embodiment of the present invention. FIG. 2 is a schematic cross-section view of a display unit 200 of the organic light-emitting display apparatus 10 of FIG. 1. FIG. 3 is a schematic cross-sectional view illustrating a comparative example against the organic light-emitting display apparatus 10 of FIG. 1.

Referring to FIGS. 1 to 3, the organic light-emitting display apparatus 10 includes a substrate 100, a display unit 200 formed on the substrate 100, an encapsulation layer 300 sealing the display unit 200, and a protection layer 400 formed on the encapsulation layer 300. Also, an upper film 500 is disposed on the protection layer 400.

The substrate 100 may be formed of a transparent, flexible plastic material. The organic light-emitting display apparatus 10 may be flexible. The transparent plastic material of the substrate 100 may be an insulating organic material including, but is not limited to, polyether sulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), or cellulose acetate propionate (CAP).

When the organic light-emitting display apparatus 10 is a bottom emission type display apparatus that displays an image in the direction of the substrate 100, the substrate 100 is transparent. However, when the organic light-emitting display apparatus 10 is a top emission type display apparatus that displays an image in the opposite direction of the substrate 100, the substrate 100 need not be transparent. In this case, the substrate 100 may be formed of a metal including, but is not limited to, carbon (C), iron (Fe), chromium (Cr), manganese (Mn), nickel (Ni), titanium (Ti), molybdenum (Mo), or stainless steel (SUS).

Referring to FIG. 2, the display unit 200 includes an organic thin film transistor (TFT) layer 200a and a pixel portion 200b. The pixel portion 200b includes an organic light-emitting device (OLED).

A buffer layer 212 is formed on the substrate 100. The buffer layer 212 prevents impurity elements from being penetrated through the substrate 100, and provides a flat surface on the substrate 100. The buffer layer 212 may be formed of various materials including an inorganic material, an organic material, or a stack thereof. The inorganic material may include, but is not limited to, silicon oxide, silicon nitride, silicon oxynitride, aluminum oxide, aluminum nitride, titanium oxide, or titanium nitride. The organic material may include polyimide, polyester, or acryl.

The buffer layer 212 may be deposited by various deposition methods, such as a plasma-enhanced chemical vapor deposition (PECVD) method, an atmospheric pressure CVD (APCVD) method, or a low pressure CVD (LPCVD) method.

An active layer 221 is formed on the buffer layer 212. The buffer layer 221 is formed of an inorganic semiconductor, such as silicon, or an organic semiconductor. The active layer 221 includes a source region, a drain region, and a channel region therebetween. For example, when the active layer 221 is formed of amorphous silicon, the active layer 221 including a source region, a drain region, and a channel region therebetween may be formed by forming an amorphous silicon layer on the front surface of the substrate 100, crystallizing the amorphous silicon layer to form a polycrystalline silicon layer, patterning the polycrystalline silicon layer, and doping a source region and a drain region.

A gate insulating film 213 is formed on the active layer 221. The gate insulating film 213 may be formed of an inorganic material, such as SiNx or SiO$_2$, to insulate the active layer 221 and a gate electrode 222.

The gate electrode 222 is formed in a predetermined region on the gate insulating film 213. The gate electrode 222 is connected to a gate line (not illustrated) to apply an on/off signal to a thin film transistor (TFT).

The gate electrode 222 may include, but is not limited to, gold (Au), silver (Ag), copper (Cu), Nickel (Ni), platinum (Pt), palladium (Pd), aluminum (Al), molybdenum (Mo), neodymium (Nd), or an alloy thereof. For example, the alloy may include, but is not limited to, an Al:Nd (neodymium) alloy or a Mo:W (tungsten) alloy.

An interlayer insulating film 214 is formed on the gate electrode 222. The interlayer insulating film 214 may be formed of an inorganic material, such as SiNx or SiO$_2$, to insulate the gate electrode 222 and source and drain electrodes 223.

The source and drain electrodes 223 are formed on the interlayer insulating film 214. For example, the source and drain electrodes 223 penetrates the interlayer insulating film 214 and the gate insulating film 213 to be in contact with the source region and the drain region of the active layer 221.

A top gate type TFT includes the active layer 221, the gate electrode 222, and the source and drain electrodes 223. Alternatively, the gate electrode 222 may be disposed under the active layer 221.

The TFT layer 200a is electrically connected to the pixel portion 200b to drive the pixel portion 200b, and is covered and protected by a planarization film 215.

The planarization film 215 may include an inorganic insulating film and/or an organic insulating film. The inorganic insulating film may include, but is not limited to, SiO$_2$, SiNx, SiON, Al$_2$O$_3$, TiO$_2$, Ta$_2$O$_5$, HfO$_2$, ZrO$_2$, barium strontium titanate (BST), or lead zirconate titanate (PZT). The organic insulating film may include, but is not limited to, a general-purpose polymer, such as polymethylmethacrylate (PMMA) and polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. Also, the planarization film 215 may include a stack of an inorganic insulating film and an organic insulating film.

The pixel portion 200b is formed on the planarization film 215. The pixel portion 200b may include a pixel electrode 231, an intermediate layer 232, and a common electrode 233.

The pixel electrode 231 is formed on the planarization film 215, and is electrically connected to the source and drain electrodes 223 through a contact hole 230 formed in the planarization film 215.

The pixel electrode 231 may be reflective. The pixel electrode 231 may include a reflection film and a transparent or semitransparent electrode layer. The reflection film may be formed of Ag, Mg, Al, Pt, Pd, Au, Ni, Nd, Ir, Cr, or a compound thereof. The transparent or semitransparent electrode layer may be formed on the reflection film. The transparent or semitransparent electrode layer may include, but is not limited to, indium tin oxide (ITO), indium zinc oxide (IZO), zinc oxide (ZnO), indium oxide (In$_2$O$_3$), indium gallium oxide (IGO), or aluminum zinc oxide (AZO).

The common electrode 233 facing the pixel electrode 231 may be a transparent or semitransparent electrode, and may be formed of a metal thin film having a small work function. The common electrode 233 may include lithium (Li), calcium (Ca), LiF/Ca, LiF/Al, Al, Ag, Mg, or a compound thereof. Also, a bus electrode or an auxiliary electrode formed of a transparent electrode material, such as ITO, IZO, ZnO, or In$_2$O$_3$, may be further formed on the metal thin film.

Therefore, the common electrode 233 transmits light emitted from an organic emission layer (not illustrated) included in the intermediate layer 232. For example, the light emitted from the organic emission layer (not illustrated) may be emitted to the common electrode 233 directly or by being reflected from the pixel electrode 231 that is reflective.

However, the organic light-emitting display apparatus 10 of the present embodiment is not limited to a top emission type display apparatus, and may be a bottom emission type display apparatus in which the light emitted from the organic emission layer (not illustrated) is emitted to the substrate 100. In this case, the pixel electrode 231 is transparent or semitransparent, and the common electrode 233 is reflective. Also, the organic light-emitting display apparatus 10 may be a dual emission type display apparatus in which light is emitted in both the top surface direction and the bottom surface direction.

A pixel definition film 216 may be formed of an insulating material on the pixel electrode 231. The pixel definition film 216 may be formed of at least one organic insulating material including, but is not limited to, polyimide, polyamide, acryl resin, benzocyclobutene, and phenol resin, using a method such as a spin coating method. The pixel definition film 216 exposes a predetermined region of the pixel electrode 231, and the intermediate layer 232 including the organic emission layer (not illustrated) is disposed in the exposed region.

The organic emission layer (not illustrated) included in the intermediate layer 232 may be formed of a low-molecular organic material or a polymer organic material. The intermediate layer 232 may further include functional layers, such as a hole transport layer (HTL), a hole injection layer (HIL), an electron transport layer (ETL), and an electron injection layer (EIL), in addition to the organic emission layer (not illustrated).

The encapsulation layer 300 is formed to completely cover the display unit 200, thereby preventing external moisture or oxygen from being penetrated into the display unit 200.

The encapsulation layer 300 may be formed of a low temperature viscosity transition (LVT) inorganic material. Herein, the viscosity transition temperature refers to a minimum temperature at which the LVT inorganic material becomes viscous. The minimum temperature may be lower than a metamorphic temperature of the material included in the organic light-emitting device.

For example, the LVT inorganic material may be a low liquidus temperature (LLT) material whose glass transition temperature may be about 200° C. or less. For example, the LLT material may include at least one of tin fluorophosphates glass, chalcogenide glass, tellurite glass, borate glass, and phosphate glass.

For example, the tin fluorophosphates glass may include about 20 wt % to about 80 wt % of tin (Sn), about 2 wt % to about 20 wt % of phosphorus (P), about 3 wt % to about 20 wt % of oxygen (O), and about 10 wt % to about 36 wt % of fluorine (F), but the composition is not limited thereto. The above-described glass materials may further include tungsten (W). The addition of tungsten may lead to more stable and uniform glass, and thus the chemical durability of the encapsulation layer 300 may be further increased.

Also, the LVT inorganic material may include tin oxide (for example, SnO or $SnO_2$). For example, when the LVT inorganic material includes SnO, the content of SnO may be about 20 wt % to about 100 wt %.

The LVT inorganic material including tin oxide may include one or more of phosphorus oxide (for example, $P_2O_5$), boron phosphate ($BPO_4$), tin fluoride (for example, $SnF_2$), niobium oxide (for example, NbO), tungsten oxide (for example, $WO_3$), but is not limited thereto.

For example, the LVT inorganic material may include, but is not limited to, SnO, a mixture of SnO and $P_2O_5$, a mixture of SnO and $BPO_4$, a mixture of SnO, $SnF_2$, and $P_2O_5$, a mixture of SnO, $SnF_2$, $P_2O_5$, and NbO, or a mixture of SnO, $SnF_2$, $P_2O_5$, and $WO_3$.

Also, the LVT inorganic material may have, but is not limited to, the following composition: 1) SnO (100 wt %); 2) SnO (80 wt %) and $P_2O_5$ (20 wt %); 3) SnO (90 wt %) and $BPO_4$ (10 wt %); 4) SnO (20-50 wt %), $SnF_2$ (30-60 wt %), and $P_2O_5$ (10-30 wt %) (where the total weight of SnO, $SnF_2$, and $P_2O_5$ is 100 wt %); 5) SnO (20-50 wt %), $SnF_2$ (30-60 wt %), $P_2O_5$ (10-30 wt %), and NbO (1-5 wt %) (where the total weight of SnO, $SnF_2$, $P_2O_5$, and NbO is 100 wt %); or 6) SnO (20-50 wt %), SnF2 (30-60 wt %), $P_2O_5$ (10-30 wt %), and $WO_3$ (1-5 wt %) (where the total weight of SnO, $SnF_2$, $P_2O_5$, and $WO_3$ is 100 wt %).

The encapsulation layer 300 may have cracks generated and propagated from particles P. Physical force may concentrate on the particles P, and thus the encapsulation layer 300 is vulnerable to a physical pressure that is applied from the outside.

For example, when the upper film 500 is stacked on the encapsulation layer 300 to form a touch panel, the encapsulation layer 300 may be broken by a physical force that is applied for attaching the upper film 500 to the encapsulating layer 300.

Referring to FIG. 3, a particle P sitting on the encapsulation layer 300 may cause a crack in the encapsulation layer 300, due to a concentration of an external force on the particle P, even when the particle P is very small. Therefore, external moisture or oxygen penetrates through the cracks, thereby degrading light-emitting characteristics of the display unit 200. For example, a dark spot and or a pixel shrinkage may occur on the organic light-emitting display apparatus 10.

Referring to FIG. 1, the protection layer 400 is formed on the encapsulation layer 300 to prevent cracks from occurring in the encapsulation layer 300 due to a physical force applied from the outside. The protection layer 400 covers the foreign particles to planarize the top surface of the encapsulation layer 300, thereby avoiding stress concentrations to the foreign particles sitting on the encapsulation layer 300.

Also, the protection layer 400 may increase a junction force with the upper film 500 for forming a touch panel, thus making it easy to perform a subsequent process.

The protection layer 400 may be formed of a material both elastic and adhesive. The protection layer 400 may be formed of silicon-based optically-curable or thermally-curable resin. For example, the protection layer 400 may be formed of silicon-based resin including cross-linked siloxane including, but is not limited to, polymethyltrifluoropropyl siloxane or polymethylvinyl-siloxane.

The protection layer 400 may be formed to a thickness of about 1 μm to about 20 μm, for example, about 3 μm to about 10 μm. The protection layer 400 having thickness of less than about 1 μm may be insufficient to cover a particle P sitting on the encapsulation layer 30. On the other hand, the protection layer 400 having thickness of greater than about 20 μm may make the organic light-emitting display apparatus 10 less flexible. Therefore, the protection layer 400 may be formed to a thickness of about 1 μm to about 20 μm. Also, the protection layer 400 may be formed to a thickness of about 3 μm to about 10 μm to cover the particle P more securely and to thin the organic light-emitting display apparatus 10.

The upper film 500 is stacked on the protection layer 400. For example, the upper film 500 may include films constituting a touch panel. However, exemplary embodiments of the present invention are not limited thereto, and the upper film 500 may include a transparent adhesive film or an optical film for attachment of a touch panel.

Figure 4:
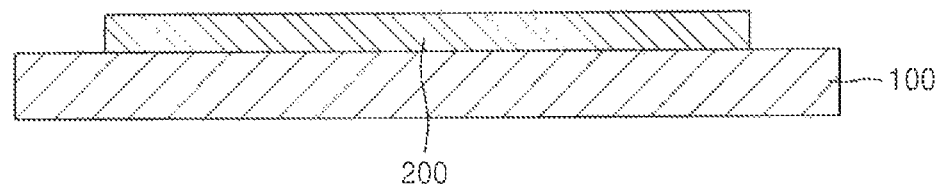
FIGS. 4 to 6 are cross-sectional views illustrating a method of manufacturing an organic light-emitting display apparatus according to an exemplary embodiment of the present invention.
Figure 5:
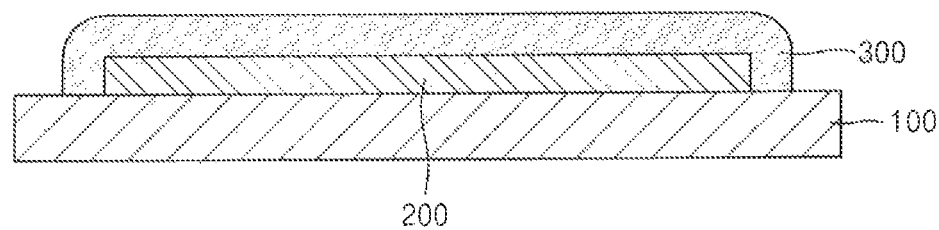
Figure 6:
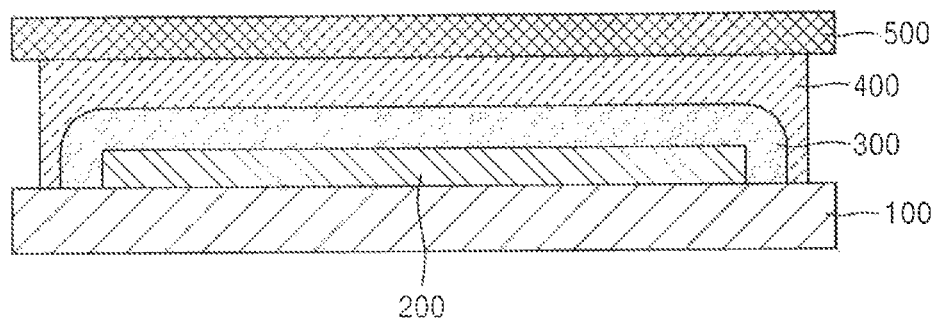

FIGS. 4 to 6 are schematic cross-sectional views illustrating a method of manufacturing an organic light-emitting display apparatus according to an exemplary embodiment of the present invention.

Hereinafter, a method of manufacturing the organic light-emitting display apparatus 10 according to an exemplary embodiment of the present invention will be described with reference to FIGS. 4 to 6. First, as illustrated in FIG. 4, a display unit 200 is formed on a substrate 100. The display unit 200 may be substantially the same as described with reference to FIG. 2 and may be using various known manufacturing methods. A detailed description thereof will be omitted herein.

Thereafter, as illustrated in FIG. 5, an encapsulation layer 300 is formed to cover the display unit 200.

As described above, the encapsulation layer 300 may be formed of an LVT inorganic material to prevent the penetration of external oxygen or moisture. The encapsulation layer 300 may be formed by depositing a preliminary layer (not illustrated) of the LVT inorganic material and by performing a healing process thereon. The depositing of the preliminary layer of the LVT inorganic material may be performed using a sputtering method, a vacuum deposition method, a low-temperature deposition method, an electron beam coating method, or an ion plating method.

For example, the preliminary layer (not illustrated) of the LVT inorganic material may be formed using a sputtering method. The sputtering method may use a dual rotary target or a facial target. For the dual rotary target, the sputtering method may be performed using argon (Ar) plasma of about 12 kW and about 0.4 Pa, and for the facial target, the sputtering method may be performed using Ar plasma of about 1 kW to 12 kW and about 0.10 Pa to about 1.5 Pa. A desired thickness of the preliminary layer (not illustrated) of the LVT inorganic material may be obtained by repeating a predetermined number of scanning operations. Also, the pressure and the power condition may vary according to the predetermined number of the scanning operations.

The preliminary layer (not illustrated) of the LVT inorganic material may include a defect such as a pinhole, and this defect may be a penetration passage of moisture or oxygen. The defect may be removed through a healing process.

In the healing process, the preliminary layer (not illustrated) of the LVT inorganic material is subject to heat treatment performed at a temperature substantially equal to or higher than a viscosity transition temperature of the LVT inorganic material. The preliminary layer of the LVT inorganic material has been formed at a temperature range of about the viscosity transition temperature of the LVT inorganic material to about the metamorphic temperature of the material included in the organic light-emitting device.

The healing process may serve to remove the pinhole of the preliminary layer of the LVT inorganic material, thereby preventing the organic light-emitting device from being exposed to the outside through the pinhole of the preliminary layer (not illustrated) of the LVT inorganic material. The healing process may be performed using an infrared (IR) oven under a vacuum atmosphere or an inert gas atmosphere (for example, an $N_2$ atmosphere or an Ar atmosphere), or may be performed using an IR oven under an $H_2O$ or $O_2$ atmosphere of about 500 ppm or less. To prevent the metamorphism of the material included in the organic light-emitting device, the healing process may be performed at a temperature of about 120° C. or less, for example, about 110° C. or less.

In this healing process, the LVT inorganic material is fluidized and then re-solidified. Accordingly, the defect such as a pinhole may be removed, and thus a compact encapsulation layer 300 may be formed.

Thereafter, as illustrated in FIG. 6, a protection layer 400 is formed, and an upper film 500 is attached on the protection layer 400.

The protection layer 400 may be elastic and adhesive. The protection layer 400 may be formed by depositing silicon-based optically or thermally-curable resin using a printing method, a spin coating method, or a flash evaporation method and then, performing an optical or thermal curing process thereon. To this end, the optically or thermally-curable resin for forming the protection layer 400 may include a hardener. In the curing process, an outgassed hardner may oxidize the common electrode 233 of FIG. 2, thereby creating a dark spot on the organic light-emitting device, To minimize the outgassing, the hardener may have a high hardening rate. For example, the hardener may be a silicon-based or acrylate-based hardener having a hardening rate of about 90% or more.

The protection layer 400 covers the rigid surface of the encapsulation layer 300, thereby preventing the occurrence of a crack in the encapsulation layer 300 by a physical force applied from the outside. Also, when there is a foreign substance on the encapsulation layer 300, the protection layer 400 covers the foreign substance to planarize the top surface of the encapsulation layer 300, thereby preventing the degradation of barrier characteristics of the encapsulation layer 300.

The upper film 500 is stacked on the protection layer 400. For example, the upper film 500 may include films constituting a touch panel. Also, the upper film 500 may include a transparent adhesive film or an optical film for attachment of a touch panel.

When the upper film 500 includes films constituting the touch panel, even when an external force is applied continuously during the use of the organic light-emitting display apparatus 10, the protection layer 400 may prevent the encapsulation layer 300 from being broken by the external force, thereby increasing the reliability of the organic light-emitting display apparatus 10.

Figure 7:
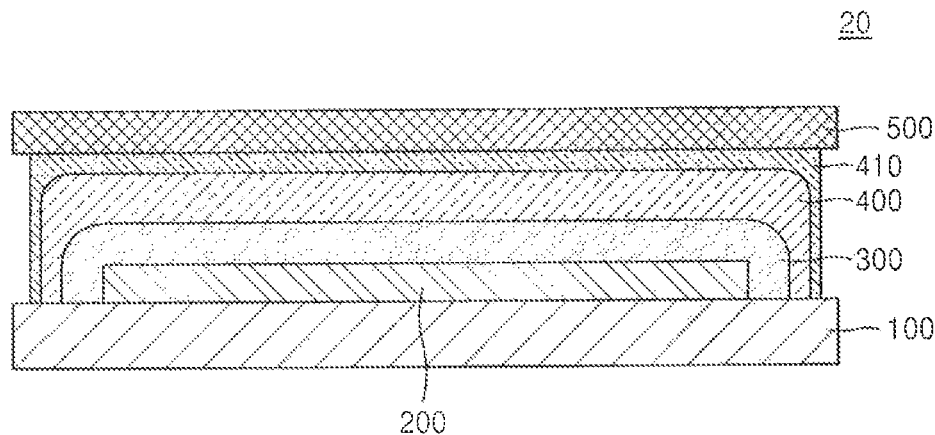
FIG. 7 is a cross-sectional view illustrating an organic light-emitting display apparatus according to an exemplary embodiment of the present invention.

FIG. 7 is a cross-section view illustrating an organic light-emitting display apparatus according to an exemplary embodiment of the present invention.

Referring to FIG. 7, the organic light-emitting display apparatus 20 includes a substrate 100, a display unit 200 formed on the substrate 100, an encapsulation layer 300 sealing the display unit 200, a protection layer 400 formed on the encapsulation layer 300, a reinforcement layer 410 on the protection layer 400, and an upper film 500 on the reinforcement layer 410.

The substrate 100, the display unit 200, the encapsulation layer 300, and the protection layer 400 are substantially the same as those illustrated in FIGS. 1 and 2, and thus a detailed description thereof will be omitted herein.

The encapsulation layer 300 may be formed of an LVT inorganic material that is resistant to moisture/oxygen. However, the encapsulation layer 300 is vulnerable to an external force due to its rigidity, and damage may be created during the attachment of the upper film 500.

The protection layer 400 may be formed on the encapsulation layer 300 to prevent the damage from occurring on the encapsulation layer 300 when a physical force is applied from the outside. Also, when there is a foreign particle sitting on the encapsulation layer 300, the protection layer 400 may cover the foreign substance to planarize the top surface of the encapsulation layer 300. The protection layer 400 may be formed of silicon-based optically-curable or thermally-curable resin. The resin may be elastic and adhesive. The reinforcement layer 410 may be further formed on the protection layer 400. The reinforcement layer 410 may absorb an external impact. The reinforcement layer 410 may be formed of epoxy-based or acrylate-based optically-curable or thermally-curable resin. The resin may be adhesive. For example, the epoxy-based curable resin may include at least one of bisphenol A, novolac, and bisphenol F, and the acrylate-based curable resin may include at least one of polyester-acrylate, urethane-acrylate, urethane-acrylate, and epoxy-acrylate. However, exemplary embodiments of the present invention are not limited thereto.

When the reinforcement layer 410 is further formed on the protection layer 400, the damage of the encapsulation layer 300 due to an external force may be prevented, the adhesion with the upper film 500 formed thereon may be increased.

The organic light-emitting display apparatus 20 of FIG. 7 may be manufactured by adding a process of forming the reinforcement layer 410 on the protection layer 400 in the manufacturing method of the organic light-emitting display apparatus 10 described with reference to FIGS. 3 to 6. The reinforcement layer 410 may be formed by coating epoxy-based or acrylate-based resin using a printing method or a spin coating method and then performing an optical or thermal curing process thereon.

Figure 8:
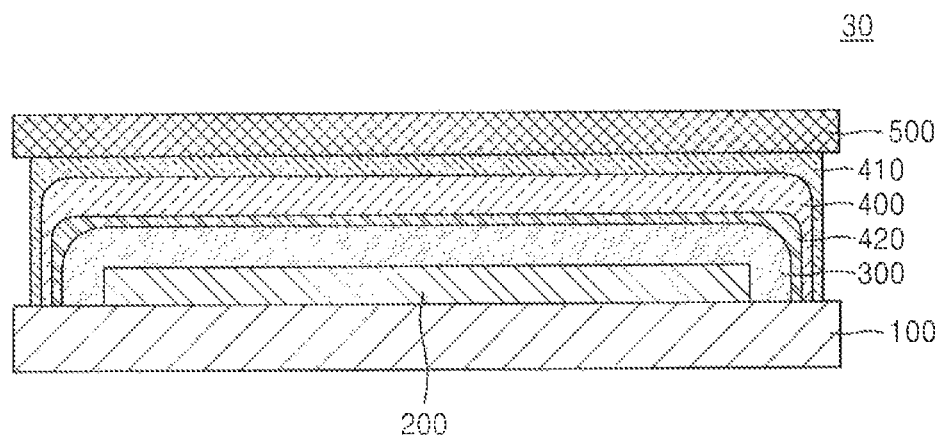
FIG. 8 is a cross-sectional view illustrating an organic light-emitting display apparatus according to an exemplary embodiment of the present invention.

FIG. 8 is a cross-section view illustrating an organic light-emitting display apparatus according to an exemplary embodiment of the present invention.

Referring to FIG. 8, the organic light-emitting display apparatus 30 includes a substrate 100, a display unit 200 formed on the substrate 100, an encapsulation layer 300 sealing the display unit 200, a protection layer 400 formed on the encapsulation layer 300, a reinforcement layer 410 on the protection layer 400, an upper film 500 on the reinforcement layer 410, and a junction layer 420 between the encapsulation layer 300 and the protection layer 400. For example, the organic light-emitting display apparatus 30 of FIG. 8 further includes the junction layer 420 in comparison with the organic light-emitting display apparatus 20 of FIG. 7.

The junction layer 420 may have a junction force for compensating for a defect, such as a crack, that is left on the surface of the encapsulation layer 300, and may reduce a film stress of the encapsulation layer 300 that increases in proportion to the thickness of the encapsulation layer 300. The junction layer 420 may be formed of acrylate-based optically-curable or thermally-curable resin.

The organic light-emitting display apparatus 30 of FIG. 8 may be manufactured by adding a process of sequentially forming the junction layer 420, the protection layer 400, and the reinforcement layer 410 on the protection layer 400 in the manufacturing method of the organic light-emitting display apparatus 10 described with reference to FIGS. 3 to 6. The junction layer 420 may be formed by coating epoxy-based or acrylate-based resin by performing a printing method or a spin coating method and then performing an optical or thermal curing process thereon. The optically-curable or thermally-curable resin for forming the junction layer 420 may include a hardener having a hardening rate of about 90% or more to minimize the amount of outgassing.

Also, in the organic light-emitting display apparatus 30 of FIG. 8, the reinforcement layer 410 may be omitted. For example, the organic light-emitting display apparatus 30 is not limited to the above-described exemplary embodiment, and may include the junction layer 420 and the protection layer 400 on the encapsulation layer 300 without the reinforcement layer 410.

As described above, the encapsulation layer may be formed of an LVT inorganic material resistant to moisture/oxygen.

Also, since the protection layer is formed on the encapsulation layer, the damage of the encapsulation layer may be prevented, and thus the reliability of the organic light-emitting display apparatus may be increased.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An organic light-emitting display apparatus comprising:
   a substrate;
   a display unit formed on the substrate;
   an encapsulation layer covering the display unit; and
   a protection layer formed on the encapsulation layer, covering completely the encapsulation;
   a reinforcement layer on the protection layer; and
   an upper film formed on the protection layer,
   wherein the encapsulation layer is formed of a low temperature viscosity transition (LVT) inorganic material, and the protection layer is formed of an elastic, adhesive material to protect the encapsulation layer from an external force.

2. The organic light-emitting display apparatus of claim 1, wherein the protection layer is formed of silicon-based optically-curable or thermally-curable resin.

3. The organic light-emitting display apparatus of claim 1, wherein the protection layer has a thickness of about 1 μm to about 20 μm.

4. The organic light-emitting display apparatus of claim 1, wherein the protection layer has a thickness of about 3 μm to about 10 μm.

5. The organic light-emitting display apparatus of claim 1, wherein the encapsulation layer comprises tin oxide.

6. The organic light-emitting display apparatus of claim 1, wherein the encapsulation layer comprises at least one of tin fluorophosphates glass, chalcogenide glass, tellurite glass, borate glass, and phosphate glass.

7. The organic light-emitting display apparatus of claim 1, wherein the reinforcement layer comprises at least one of bisphenol A, novolac, bisphenol F, polyester-acrylate, urethane-acrylate, and epoxy-acrylate.

8. The organic light-emitting display apparatus of claim 1, wherein a junction layer interposed between the encapsulation layer and the protection layer.

9. The organic light-emitting display apparatus of claim 1, wherein the upper film comprises films constituting a touch panel.

10. The organic light-emitting display apparatus of claim 1, wherein the LVT inorganic material has a glass transition temperature less than about 200° C.

* * * * *